(12) United States Patent  
Kawahara et al.

(10) Patent No.: US 12,513,976 B2  
(45) Date of Patent: Dec. 30, 2025

(54) SILICON CARBIDE SEMICONDUCTOR DEVICE AND POWER CONVERSION DEVICE

(71) Applicant: Mitsubishi Electric Corporation, Tokyo (JP)

(72) Inventors: Kotaro Kawahara, Tokyo (JP); Shiro Hino, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 432 days.

(21) Appl. No.: 18/017,410

(22) PCT Filed: Sep. 24, 2020

(86) PCT No.: PCT/JP2020/036107  
§ 371 (c)(1),  
(2) Date: Jan. 23, 2023

(87) PCT Pub. No.: WO2022/064613  
PCT Pub. Date: Mar. 31, 2022

(65) Prior Publication Data  
US 2023/0282741 A1     Sep. 7, 2023

(51) Int. Cl.  
*H10D 84/00*     (2025.01)  
*H10D 62/832*    (2025.01)  
*H10D 64/64*     (2025.01)

(52) U.S. Cl.  
CPC ....... *H10D 84/156* (2025.01); *H10D 62/8325* (2025.01); *H10D 64/64* (2025.01)

(58) Field of Classification Search  
CPC .. H10D 84/156; H10D 62/8325; H10D 64/64; H10D 8/60; H10D 30/668;

(Continued)

(56) References Cited

U.S. PATENT DOCUMENTS

2013/0168700 A1* 7/2013 Furukawa .......... H10D 62/8325  
                                                        257/77  
2014/0175508 A1   6/2014 Suzuki et al.

(Continued)

FOREIGN PATENT DOCUMENTS

CN      102947934 B    12/2015  
JP      2014-127555 A   7/2014

(Continued)

OTHER PUBLICATIONS

Chinese Office Action issued Oct. 31, 2024, in corresponding Chinese Patent Application No. 202080105188.X, 1 15pp.

(Continued)

*Primary Examiner* — Mohammad A Rahman  
(74) *Attorney, Agent, or Firm* — XSENSUS LLP

(57) ABSTRACT

A silicon carbide semiconductor device includes: a dummy sense region; and a drift layer of a first conductivity type, wherein a MOSFET with a built-in SBD including a first well region of a second conductivity type connected to a source electrode is formed in an active region, a MOSFET with a built-in SBD including a second well region of a second conductivity type connected to a sense pad is formed in an active sense region, and a third well region of a second conductivity type which is not ohmic-connected to any of the source electrode and the sense pad is formed on an upper layer part of the n-type drift layer in the dummy sense region. A gate electrode of the MOSFET with the built-in SBD in the active region and the MOSFET with the built-in SBD in the active sense region is connected to a gate pad.

12 Claims, 21 Drawing Sheets

(58) Field of Classification Search
CPC .... H10D 30/669; H10D 12/031; H10D 64/23; H10D 84/146; H10D 84/811; H10D 84/016; H10D 84/038; H10D 84/83; Y02B 70/10; H01L 21/76
See application file for complete search history.

(56) References Cited

U.S. PATENT DOCUMENTS

| | | |
|---|---|---|
| 2014/0225114 A1 | 8/2014 | Furukawa et al. |
| 2014/0231827 A1* | 8/2014 | Watanabe ............ H10D 84/146 438/572 |
| 2016/0079411 A1 | 3/2016 | Hino et al. |
| 2019/0371936 A1 | 12/2019 | Nagahisa et al. |

FOREIGN PATENT DOCUMENTS

| | | |
|---|---|---|
| JP | 2014-157896 A | 8/2014 |
| WO | 2011/161721 A1 | 12/2011 |
| WO | 2013/042406 A1 | 3/2013 |
| WO | 2014/162969 A1 | 10/2014 |
| WO | 2018/155566 A1 | 8/2018 |

OTHER PUBLICATIONS

International Search Report and Written Opinion mailed on Dec. 15, 2020, received for PCT Application PCT/JP2020/036107, filed on Sep. 24, 2020, 10 pages including English Translation.

* cited by examiner

F I G. 6
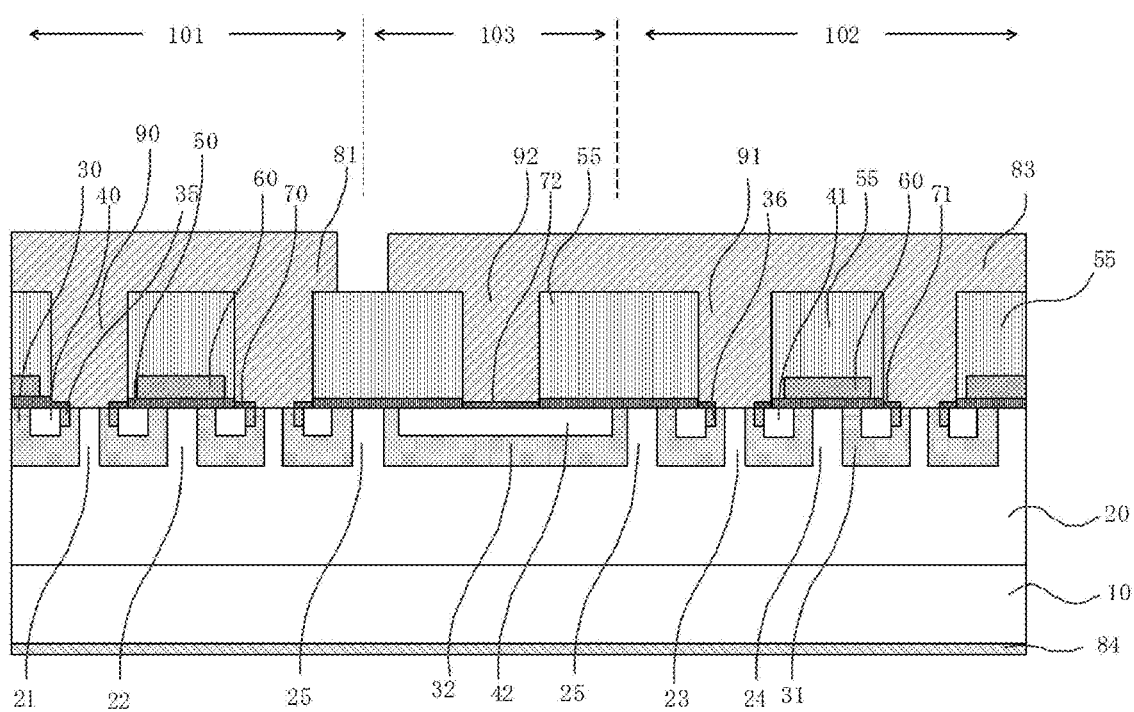

F I G. 9
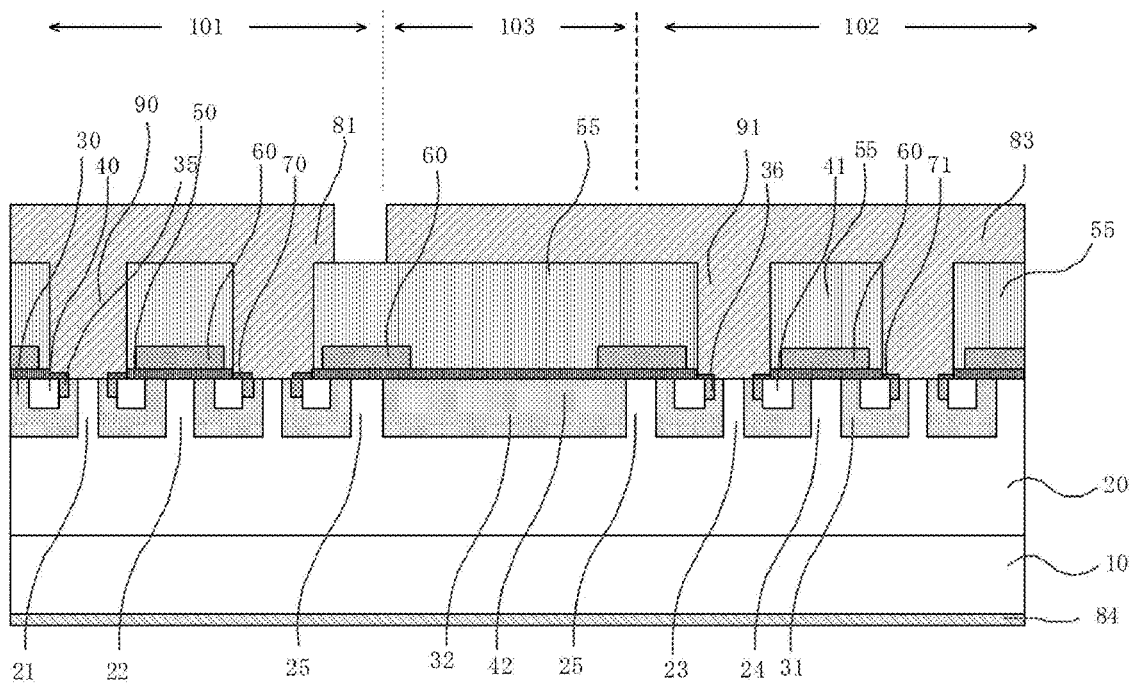

F I G. 1 0
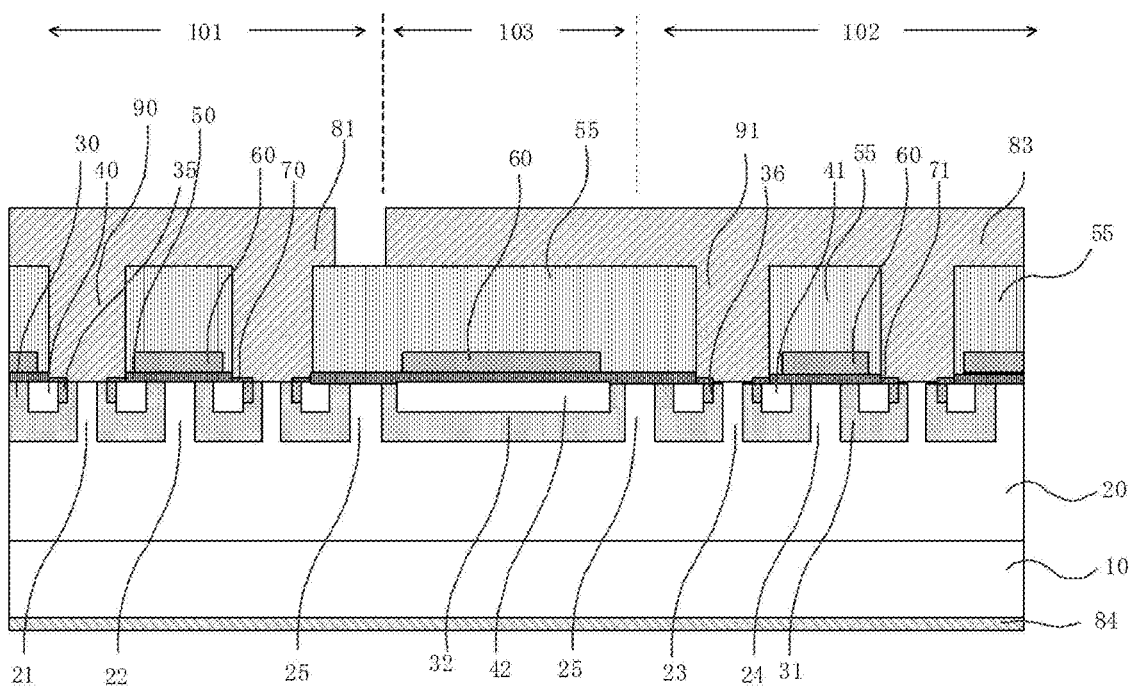

F I G. 1 1
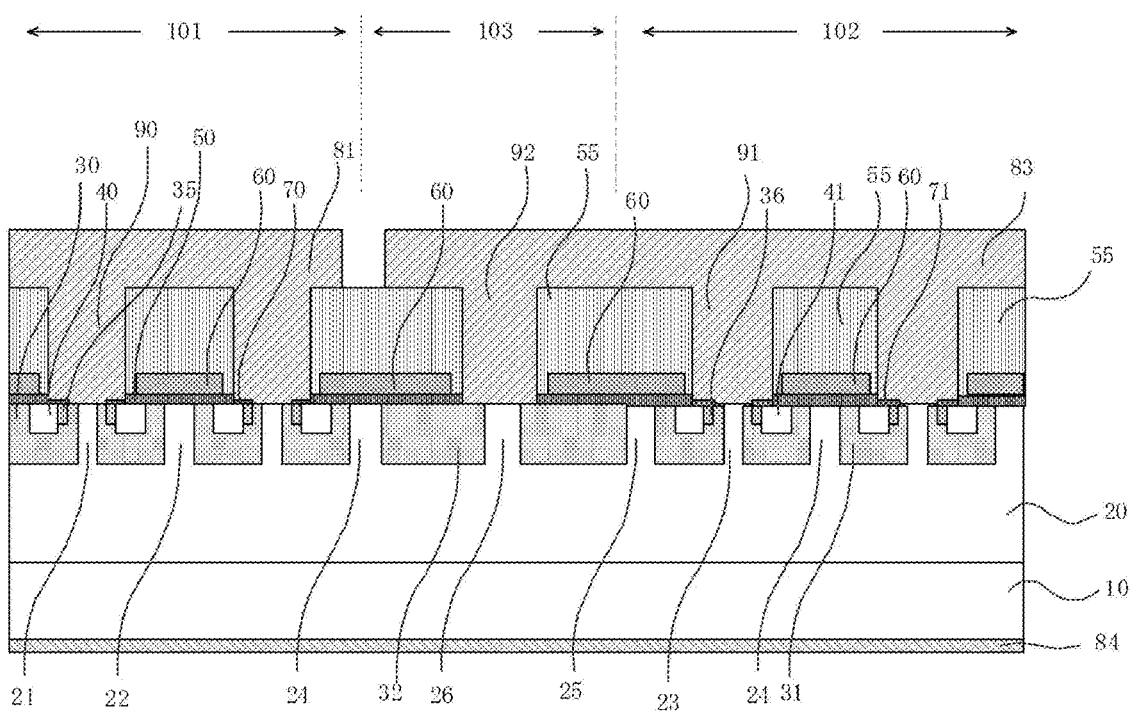

F I G. 1 3
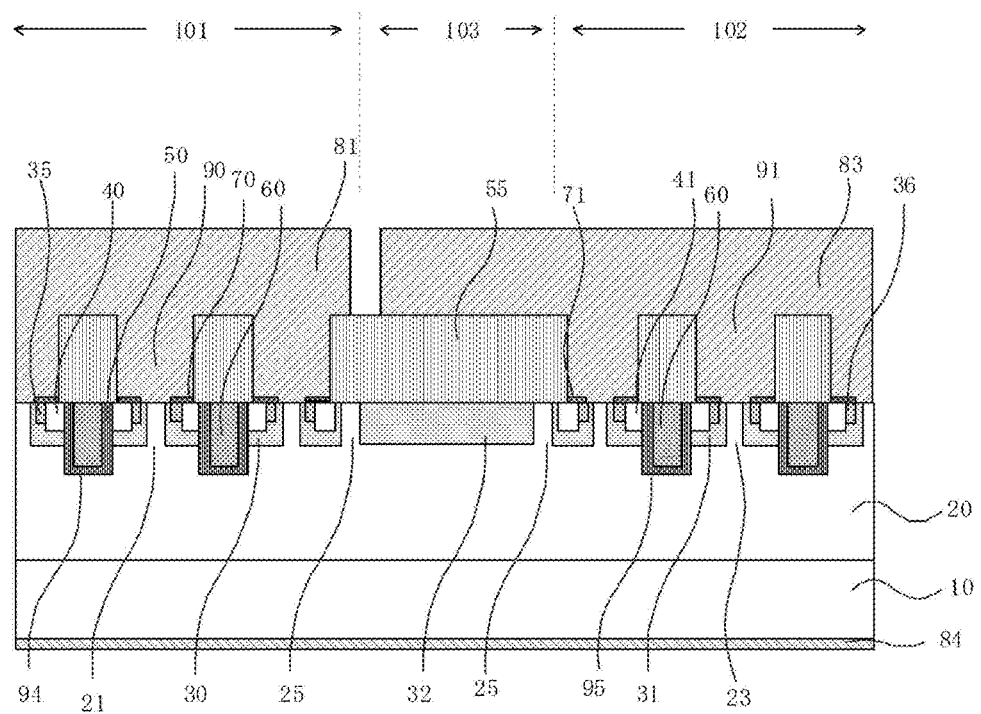

F I G. 1 4
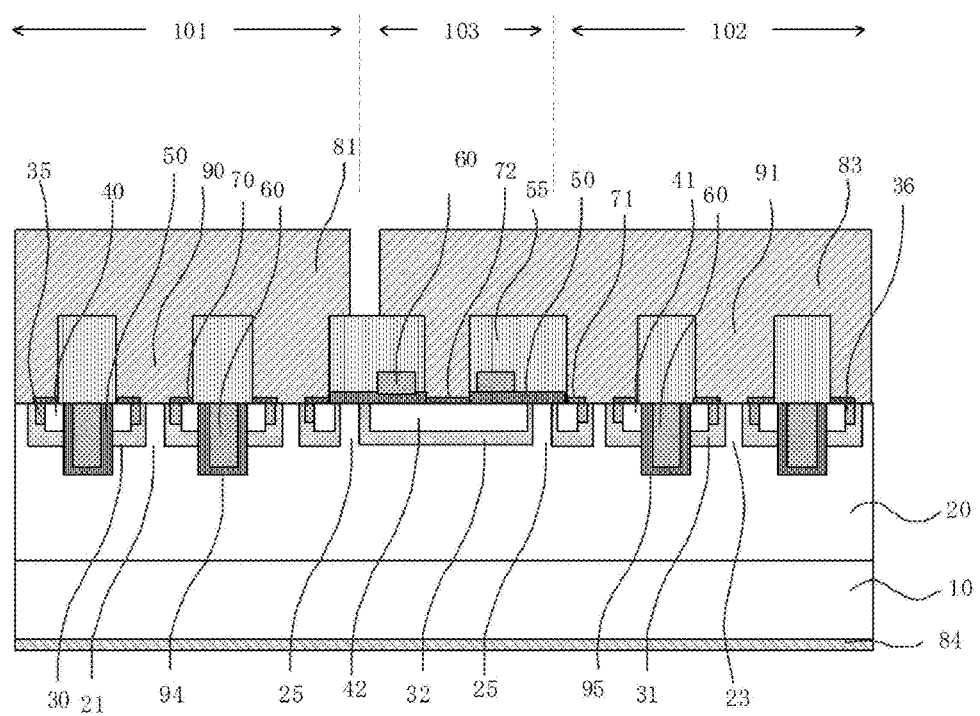

F I G. 1 7
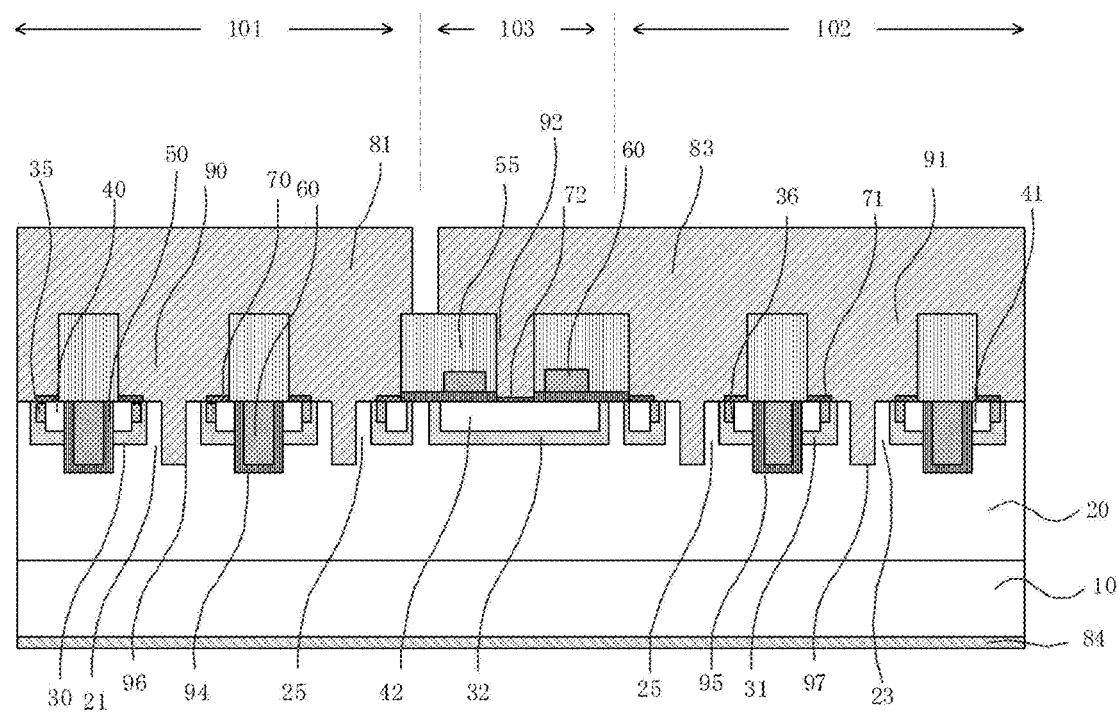

F I G. 2 1
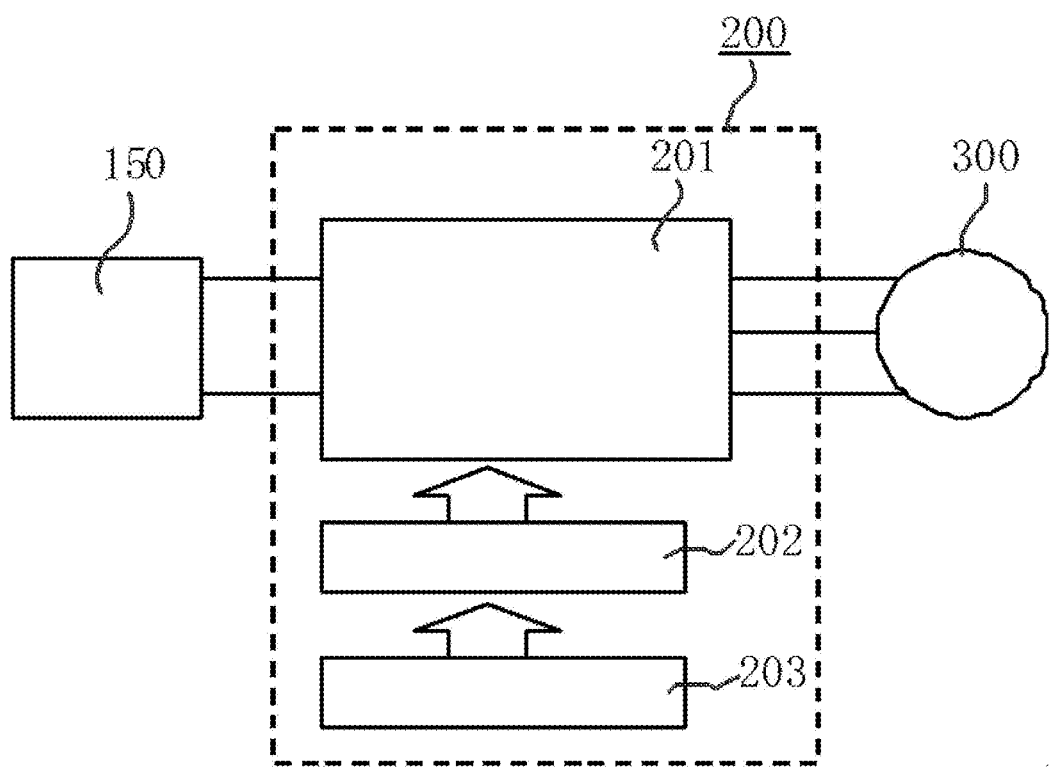

SILICON CARBIDE SEMICONDUCTOR DEVICE AND POWER CONVERSION DEVICE

CROSS-REFERENCE TO RELATED APPLICATION

The present application is based on PCT filing PCT/JP2020/036107, filed Sep. 24, 2020, the entire contents of which are incorporated herein by reference.

TECHNICAL FIELD

The present disclosure relates to a silicon carbide semiconductor device made of silicon carbide and a power conversion device.

BACKGROUND ART

Known is a problem in terms of reliability that when forward current, that is to say, bipolar current continuously flows in a pn diode made up using silicon carbide (SiC), stacking fault occurs in crystal, and forward voltage is shifted. Considered as a reason thereof is that stacking fault as planar defect is extended from basal plane dislocation in a silicon carbide substrate, for example, as a start point by recombination energy when a minority carrier implanted through the pn diode is recombined with a major carrier. This stacking fault blocks flow of current, thus extension of the stacking fault reduces the current and increases forward voltage, and causes reduction in reliability of a semiconductor device.

Such an increase in the forward voltage similarly occurs also in a vertical metal oxide semiconductor field effect transistor (MOSFET) using silicon carbide. The vertical MOSFET includes a parasitic pn diode (body diode) between a source and a drain, and when the forward current flows in this body diode, reduction in reliability similar to the pn diode occurs also in the vertical MOSFET. When a body diode of a SiC-MOSFET is used as a reflux diode of a MOSFET, reduction in MOSFET characteristics may occur in some cases.

Known as a method of solving the problem in terms of the reliability caused by a forward current conduction to the parasitic pn diode described above is a method of including and using a built-in Schottky barrier diode (SBD), which is a unipolar type diode, as a reflux diode in a semiconductor device, which is a unipolar type transistor, such as a MOSFET, and a MOSFET including a built-in SBD has a current sensing function (for example, refer to Patent Document 1).

PRIOR ART DOCUMENTS

Patent Document(s)

Patent Document 1: International Publication WO 2014/162969 pp. 19 to 21

SUMMARY

Problem to be Solved by the Invention

In the semiconductor device having the current sensing function, a sense pad needs to have a current sense pad with a large area to some extent for an external connection, however, when a whole lower part of the current sense pad serves as an active current sense region in which sense current flows, invalid sense current increases, thus a loss increases. Accordingly, a dummy sense region is provided separately from the active current sense region in the lower part of the current sense pad in some cases.

When a p-type well region of the dummy sense region including the MOSFET with the built-in SBD is connected to the current sense pad as with Patent Document 1, large reflux current flows in an ammeter connected to the sense pad in a reflux operation, and minute current flows in an ammeter in a sense operation. A current capacity of the ammeter needs to be small to detect the sense current with high accuracy, however, the current capacity of the ammeter needs to be large to prevent breakage of the ammeter in consideration of a flow of large reflux current into the ammeter from the dummy sense region, thus it is difficult to achieve both the detection of the sense current with high accuracy and resistance to reflux current. It is also considered that a well region having a conductivity type opposite to that of a drift layer of the dummy sense region of the MOSFET including the built-in SBD is connected to a source pad in which main current flows to prevent large current from flowing into the ammeter also in the reflux operation, however, the current sense region needs to be additionally increased to prevent the large current in such a manner while keeping an area of the sense pad, thus an active region of the MOSFET is narrowed. Furthermore, when the well region of the dummy sense region and the source pad are connected to each other, forward current flows in a pn diode located between the p-type well region and the n-type drift layer of the dummy sense region in the reflux operation, and deterioration in power conduction occurs in some cases,

Means to Solve the Problem

A silicon carbide semiconductor device and a power conversion device according to the present disclosure include: a dummy sense region formed between an active region and an active sense region; a silicon carbide semiconductor substrate of a first conductivity type; a drift layer of a first conductivity type formed on the semiconductor substrate; a plurality of first well regions of a second conductivity type provided on the drift layer of the active region; a plurality of first separation regions of a first conductivity type each formed adjacent to each of the first well regions; a first ohmic electrode provided on the first well regions; a source region of a first conductivity type formed on surface layer parts of the first well regions; a source electrode provided to have contact with the first separation regions in Schottky connection, and electrically connected to the first ohmic electrode; a second well region of a second conductivity type provided on a surface layer of the drift layer of the active sense region separately from the first well regions; a plurality of third separation regions of a first conductivity type formed adjacent to the second well region; a second ohmic electrode provided on the second well region; a sense pad provided to have contact with the third separation regions in Schottky connection, electrically connected to the second ohmic electrode, and formed in the active sense region and the dummy sense region; a sense source region of a first conductivity type formed on a surface layer part of the second well region; a gate insulating film formed to have contact with the first well regions and the second well region; a gate electrode formed to face the first well regions and the second well region via the gate insulating film; a gate pad electrically connected to the gate electrode; and a third well region of a second conductivity type which is formed on a surface layer of the drift layer in the dummy sense region between the first well regions and the second well region, is separated from the first well regions and the second well region, and is not ohmic-connected to any of the source electrode and the sense pad.

Effects of the Invention

According to the silicon carbide semiconductor device of the present disclosure, achievable are the silicon carbide semiconductor device and the power conversion device capable of connecting an ammeter which can measure minute current to the sense pad and measuring sense current with high accuracy while preventing occurrence of deterioration in power conduction in the silicon carbide semiconductor device.

BRIEF DESCRIPTION OF DRAWINGS

FIG. 6 A cross-sectional view of a part of the silicon carbide semiconductor device according to another embodiment of the embodiment 1 of the present invention.

FIG. 9 A cross-sectional view of a part of the silicon carbide semiconductor device according to another embodiment of the embodiment 2 of the present invention.

FIG. 10 A cross-sectional view of a part of the silicon carbide semiconductor device according to another embodiment of the embodiment 2 of the present invention.

FIG. 11 A cross-sectional view of a part of the silicon carbide semiconductor device according to the embodiment 2 of the present invention.

FIG. 13 A cross-sectional view of a part of the silicon carbide semiconductor device according to an embodiment 3 of the present invention.

FIG. 14 A cross-sectional view of a part of the silicon carbide semiconductor device according to another embodiment of the embodiment 3 of the present invention.

FIG. 17 A cross-sectional view of a part of the silicon carbide semiconductor device according to another embodiment of the embodiment 3 of the present invention.

FIG. 21 A schematic diagram illustrating a configuration of a power conversion device according to an embodiment 4 of the present invention.

DESCRIPTION OF EMBODIMENT(S)

Figure 1:
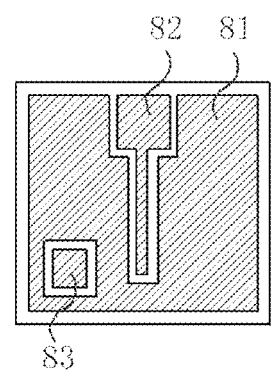
FIG. 1 A plan view of a silicon carbide semiconductor device according to an embodiment 1 of the present invention.

Embodiment are described hereinafter with reference to the appended drawings. The drawings are schematically illustrated, thus a size of an image and a mutual relationship of positions thereof each illustrated in the different drawings are not necessarily illustrated accurately, but can be appropriately changed. In the description hereinafter, the same reference numerals are assigned to the similar constituent elements in the illustration, and the same applies to names and functions thereof. Thus, a detailed description thereof may be omitted in some cases. A vertical direction in the present disclosure indicates a normal direction of a semiconductor substrate of a silicon carbide semiconductor device, and a lateral direction indicates a planar direction of the semiconductor substrate. A front surface side indicates a side on which a drift layer of the semiconductor substrate is formed, and a back surface side indicates an opposite side of the front surface side.

Embodiment 1

Firstly described is a configuration of a silicon carbide semiconductor device according to an embodiment 1 of the present disclosure. In the description of the present disclosure, a first conductivity type is an n type and a second conductivity type is a p type.

FIG. 1 is a schematic diagram of one chip of a silicon carbide MOSFET (SiC-MOSFET) the silicon carbide semiconductor device according to the embodiment 1 viewed from an upper surface thereof. Provided in FIG. 1 are a source electrode 81 (source pad) in which main current flows on substantially a whole surface of the chip, a gate pad 82 formed to be insulated from the source electrode 81, and a sense pad 83 formed to be insulated from the source electrode 81 in the same manner as the gate pad 82. A lower part of the source electrode 81 substantially corresponds to an active region 101, and a MOSFET including a built-in SBD is disposed in the active region 101.

Figure 2:
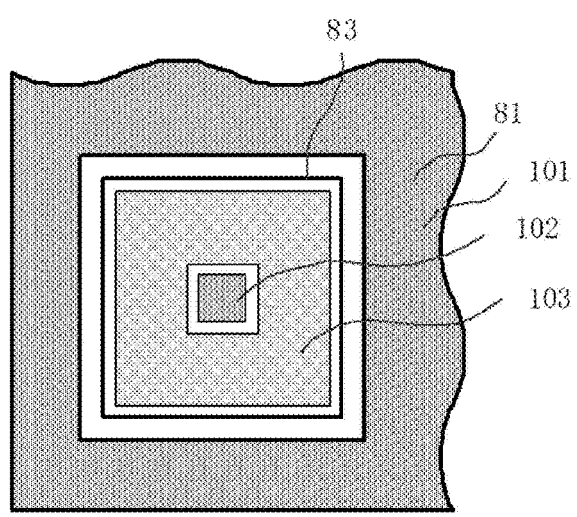
FIG. 2 A plan view of a part of the silicon carbide semiconductor device according to the embodiment 1 of the present invention.

FIG. 2 is an enlarged plan view of an area near the sense pad 83 in FIG. 1. The active region 101 in which the MOSFET including the built-in SBD is disposed is formed on the lower part of the source electrode 81 around the sense pad 83, and an active sense region 102 in which the MOSFET including the built-in SBD is disposed is formed on a part of the lower part of the sense pad 83. A dummy sense region 103 is formed on the lower part of the sense pad 83 where the active sense region 102 is not formed.

Figure 3:
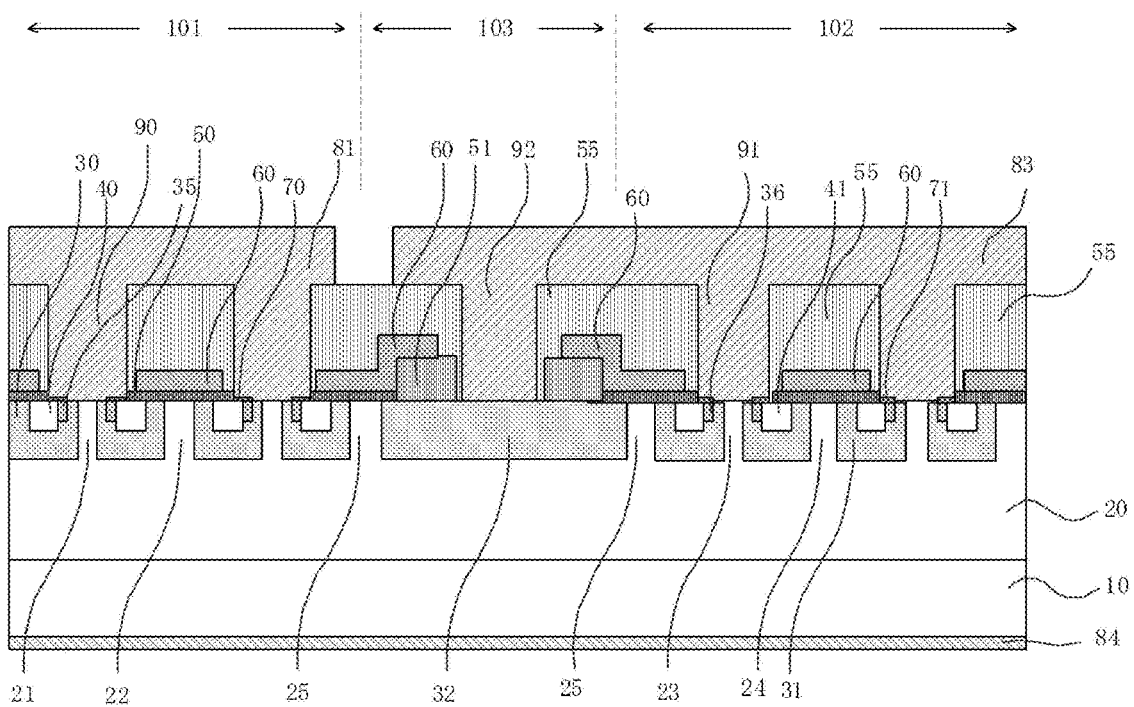
FIG. 3 A cross-sectional view of a part of the silicon carbide semiconductor device according to the embodiment 1 of the present invention.

FIG. 3 is a cross-sectional view of a region corresponding to a region from the active region 101 to the active sense region 102 via the dummy sense region 103 illustrated in FIG. 2.

In FIG. 3, a drift layer 20 made of n-type silicon carbide is epitaxially grown on a surface as a first main surface of the semiconductor substrate 10 having 4H polytype and made of an n-type low-resistive silicon carbide. A plane direction of the first main surface of the semiconductor substrate 10 is a (0001) plane inclined with respect to a c axis by 4 degrees.

A region made of p-type silicon carbide is formed in a surface layer part of the drift layer 20. A plurality of well regions 30 are formed in the active region 101, a plurality of sense well regions 31 are formed in the active sense region 102, and a dummy sense well region 32 are formed in the dummy sense region 103.

In the active region 101, an n-type first separation region 21 as a part of the drift layer 20 is formed in a center part of each of the plurality of well regions 30 in a plan view, and a p-type well contact region 35 having a high impurity concentration and an n-type source region 40 having a higher n-type impurity concentration than the drift layer 20 are formed in an area from the first separation region 21 in an inner part of the well region 30 toward an outer side. At least a part of the first separation region 21 is adjacent to the well region 30. The well region 30 is a first well region.

An n-type second separation region (JFET region) 22 as a part of the drift layer 20 is formed between the well regions 30 in the active region 101. A gate electrode 60 which is a low-resistive polycrystal silicon is formed on the second separation region 22 via a silicon oxide gate insulating film 50.

An ohmic electrode 70 is formed on the source region 40 and the well contact region 35, and a source electrode 81 is formed on the ohmic electrode 70 and the first separation region 21. The first separation region 21 is Schottky-joined to the source electrode 81, and the source region 40 and the well contact region 35 are ohmic-connected to the source electrode 81, respectively. The obmic electrode 70 is a first ohmic electrode.

In the active sense region 102, an n-type third separation region 23 as a part of the drift layer 20 is formed in a center part of each of the plurality of sense well regions 31, and a p-type sense contact region 36 having a high impurity concentration and an n-type sense source region 41 having a higher n-type impurity concentration than the drift layer 20 are formed in an area from the third separation region 23 in an inner part of the sense well region 31 toward an outer side. At least a part of the third separation region 23 is adjacent to the sense well region 31. The sense well region 31 is a second well region.

An n-type fourth separation region (JFET region) 24 as a part of the drift layer 20 is formed between the sense well regions 31 in the active sense region 102. The gate electrode 60 which is a low-resistive polycrystal silicon is formed on the fourth separation region 24 via the silicon oxide gate insulating film 50.

A sense ohmic electrode 71 is formed on the sense source region 41 and the sense contact region 36, and the sense pad 83 is formed on the sense ohmic electrode 71 and the third separation region 23. The third separation region 23 is Schottky-joined to the sense pad 83, and the sense source region 41 and the sense contact region 36 are ohmic-connected to the sense pad 83, respectively. The sense ohmic electrode 71 is a second ohmic electrode.

The MOSFET with the built-in SBD of a unit cell having the same size and configuration as the active region 101 is formed in the active sense region 102.

The dummy sense well region 32 is formed in the dummy sense region 103 so as not to be ohmic-connected to any of the source electrode 81 and the sense pad 83.

The gate insulating film 50 and a field insulating film 51 made of silicon oxide with a larger film thickness than the gate insulating film 50 are formed on an upper part of the dummy sense well region 32. In the cross-sectional view in FIG. 3, the sense pad 83 is formed on the dummy sense well region 32, however, the dummy sense well region 32 and the sense pad 83 are not ohmic-connected but are Schottky-connected to each other.

Herein, an n-type fifth separation region 25 as a part of the drift layer 20 is formed between the well region 30 and the dummy sense well region 32. The n-type fifth separation region 25 as a part of the drift layer 20 is also formed between the sense well region 31 and the dummy sense well region 32. The dummy sense well region 32 is a third well region.

An interlayer insulating film 55 made of silicon oxide is formed on the gate insulating film 50, the gate electrode 60, or the field insulating film 51 in an area from the active region 101 to the dummy sense region 103 and the active sense region 102.

Although not shown in the drawings, the gate electrode 60 in the active region 101 and the gate electrode 60 in the active sense region are connected to each other, and these gate electrodes 60 are electrically connected via the gate pad 82 illustrated in FIG. 1 and a gate contact hole (not shown) provided in the interlayer insulating film 55.

In the cross-sectional view in FIG. 3, the source electrode 81 has contact with the ohmic electrode 70 and the first separation region 21 through a first contact hole 90 in the active region 101. The sense pad 83 has contact with the sense ohmic electrode 71 and the third separation region 23 through a second contact hole 91 in the active sense region 102. The sense pad 83 has contact with the dummy sense well region 32 through a third contact hole 92 in the dummy sense region 103.

The source electrode 81, the sense pad 83, and the gate pad 82 are formed of the same electrode material such as Al.

Furthermore, a drain electrode 84 is formed on a back surface side of the semiconductor substrate 10.

Described next is a method of manufacturing the SiC-MOSFET with the built-in SBD as the silicon carbide semiconductor device according to the present embodiment.

The drift layer 20 made of n-type silicon carbide is epitaxially grown on the semiconductor substrate 10 having 4H polytype and made of an n-type low-resistive silicon carbide with the first main surface having a plane direction being a (0001) plane with an off angle by a chemical vapor deposition (CVD) method to have a thickness of 5 μm to 100 μm at an impurity concentration of $1 \times 10^{14}$ to $1 \times 10^{17}$ cm$^{-3}$.

Subsequently, an implantation mask is formed by photo-resist, for example, in a predetermined region in a surface of the drift layer 20, and aluminum (Al) as a p-type impurity is ion-implanted. At this time, a depth of the ion implantation of Al is approximately equal to or larger than 0.5 μm and equal to or smaller than 3 μm so as not to exceed a thickness of the drift layer 20. An impurity concentration of ion-implanted Al is set within a range from $1 \times 10^{17}$ cm$^{-3}$ to $1 \times 10^{19}$ cm$^{-3}$ to be higher than that of the drift layer 20. Then, the implantation mask is removed. The region where Al is ion-implanted by the present process serves as the well region 30, the sense well region 31, and the dummy sense well region 32.

In the similar manner, Al is ion-implanted in a predetermined region at a higher impurity concentration than that of the well region 30 to form the well contact region 35 and the sense contact region 36.

Subsequently, an implantation mask is formed by photoresist, for example, so that a predetermined position inside the well region 30 and the sense well region 31 is opened, and nitrogen (N) as an n-type impurity is ion-implanted. An ion-implantation depth of N is shallower than the thickness of the well region 30. The impurity concentration of the ion-implanted N is set within a range from $1\times10^{18}$ cm$^{-3}$ to $1\times10^{21}$ cm$^{-3}$ to be higher than a p-type impurity concentration of the well region 30. A region showing the n type in the region where N is implanted in the present process serves as the source region 40 and the sense source region 41.

Next, annealing is performed by a thermal treatment device in inactive gas atmosphere such as argon (Ar) gas atmosphere at a temperature of 1300 to 1900° C. for thirty seconds to one hour. The ion-implanted N and Al are electrical activated by the annealing.

Subsequently, the field insulating film 51 made of silicon oxide with a film thickness of 0.5 μm to 2 μm is formed on a semiconductor layer in a region other than a region substantially corresponding to a region where the well region 30 and the sense well region 31 are formed using a CVD method or a photolithography technique, for example. The field insulating film 51 is also formed on the dummy sense well region 32.

Next, a surface of silicon carbide which is not covered by the field insulating film 51 is thermally oxidized to form a silicon oxide film as the gate insulating film 50 having a desired thickness. Subsequently, a polycrystal silicon film having conductivity is formed on the gate insulating film 50 and the field insulating film 51 by a decompression CVD method, and is patterned to form the gate electrode 60. Next, the interlayer insulating film 55 made of silicon oxide is formed by a decompression CVD method. Formed subsequently through the interlayer insulating film 55 and the gate insulating film 50 are a first contact hole 90 reaching the well contact region 35 and the source region 40 in the active region 101, a third contact hole 92 reaching the dummy sense well region 32 in the dummy sense region 103, and a second contact hole 91 reaching the sense contact region 36 and the sense source region 41 in the active sense region 102.

Next, after a metal film containing Ni as a main component is formed by a sputtering method, for example, a thermal treatment is performed at a temperature of 600° C. to 1000° C., and the metal film containing Ni as the main component and a silicon carbide layer in the first contact hole 90 and the second contact hole 91 are reacted to form silicide between the silicon carbide layer and the metal layer. Subsequently, a remaining metal film other than silicide made by reaction is removed by wet etching. The ohmic electrode 70 and the sense ohmic electrode 71 are thereby formed.

Subsequently, a metal film containing Ni as a main component is formed on a back surface (second main surface) of the semiconductor substrate 10 and a thermal treatment is performed thereon to form a back surface ohmic electrode (not shown) on a back side of the semiconductor substrate 10.

Next, removed using patterning by photoresist, for example, is the interlayer insulating film 55 located in a position where a gate contact hole (not shown) is to be formed on the gate electrode 60 in a region where the gate pad 82 is formed or an area around the region . . .

Subsequently, a metal film Schottky-connected to the drift layer 20 is stacked by a sputtering method, for example, to form the source electrode 81 on the first separation region 21 and the ohmic electrode 70 in the first contact hole 90 and the interlayer insulating film 55 using patterning by photoresist, for example. The source electrode 81 needs not be made of one type of metal, but may be stacking films made of two or more types of metal such as Al and Ti stacked on each other. An electrode made of a different material may be applied only to a position Schottky-connected to an n-type region such as the first separation region 21 and the third separation region 23. Together with the formation of this source electrode 81, the gate pad 82 electrically separated from the source electrode 81 is formed on the gate electrode 60 in the gate contact hole, and the sense pad 83 electrically separated from the source electrode 81 is formed on the third separation region 23 and the sense ohmic electrode 71 in the second contact hole 91.

Furthermore, the drain electrode 84 as the metal film is formed on a surface of a back surface ohmic electrode (not shown) formed on a back surface of the substrate, thus the silicon carbide semiconductor device according to the present embodiment illustrated in FIGS. 1 to 3 is completed.

Described next is a case of mainly a reflux operation in the silicon carbide semiconductor device according to the present embodiment of the present disclosure.

Figure 4:
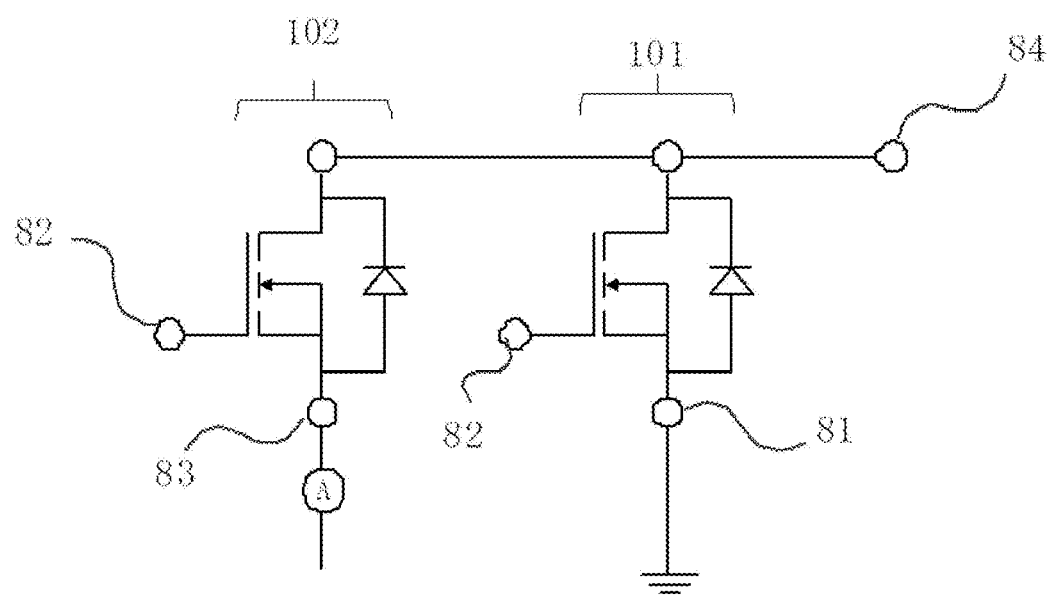
FIG. 4 An electrical diagram of the silicon carbide semiconductor device according to the embodiment 1 of the present invention and a configuration around the silicon carbide semiconductor device.

Described is an electrical diagram of the silicon carbide semiconductor device according to the present disclosure. FIG. 4 is an electrical diagram of the silicon carbide semiconductor device according to the present disclosure and a configuration around the silicon carbide semiconductor device. Herein, a MOSFET including terminals of the source electrode 81, the drain electrode 84, and the gate pad 82 is disposed in the active region 101, and a MOSFET for sensing including terminals of the sense pad 83, the drain electrode 84, and the gate pad 82 is disposed in the active sense region 102. The sense pad 83 is connected to an external ammeter. ON/OFF operation of the MOSFET is performed by changing voltage of the gate pad 82. A diode antiparallelly connected to the MOSFET is a combination of a body diode of the MOSFET and the built-in SBD.

In the reflux operation, drain voltage (voltage of the drain electrode 84) is lower than source voltage (voltage of the source electrode 81), and voltage of several V occurs between the source and the drain. In the active region 101, the SBD turned on at lower voltage than the body diode made up of the well region 30 and the drift layer 20 is formed between the first separation region 21 and the source electrode 81, thus the reflux current basically flows in the SBD, and does not flow in the well region 30.

Also in the active sense region 102, sense source voltage (voltage of the sense pad 83) has a value closer to the source voltage than the drain voltage, thus also in the active sense region 102, the SBD is formed between the third separation region 23 and the sense pad 83, and the reflux current basically flows in the SBD, and does not flow in the sense well region 31 in the reflux operation in the manner similar to the active region 101.

In the dummy sense region 103, the SBD is not formed in this structure, however, the dummy sense well region 32 is not ohmic-connected to the source electrode 81 but is Schottky-connected to the sense pad 83, thus the current does not flow in the drain electrode 84 from the source electrode 81 or the sense pad 83 through the dummy sense well region 32 also in the reflux operation. That is to say, suppressed is a flow of forward current in a pn junction between the dummy sense well region 32 and the drift layer 20.

In this manner, the silicon carbide semiconductor device of the present embodiment can prevent increase in invalid current caused by the sense current without locating the active sense region in the whole lower part of the sense pad for current sensing in the MOSFET with the built-in SBD having the current sensing function. Furthermore, the dummy sense well region in the dummy sense region provided between the active region and the sense region is not connected to any of source potential and sense source potential, thus occurrence of deterioration in power conduction caused by a flow of forward current in the pn diode in the reflux operation can be suppressed.

Thus, according to the silicon carbide semiconductor device of the present embodiment, deterioration in power conduction can be suppressed without increasing the invalid current caused by the sense current. The dummy sense region is provided, thus the sense current can be measured with high accuracy not by a large capacity ammeter but by a small capacity ammeter, and also in terms of this, reliably of the element can be improved.

In the SIC-MOSFET as the silicon carbide semiconductor device according to the present embodiment, the gate electrode 60 is formed on the gate insulating film 50 and the field insulating film 51 on the dummy sense well region 32 as shown by the cross-sectional view in FIG. 3, however, the other structure may be adopted to the structure on the dummy sense well region 32.

Figure 5:
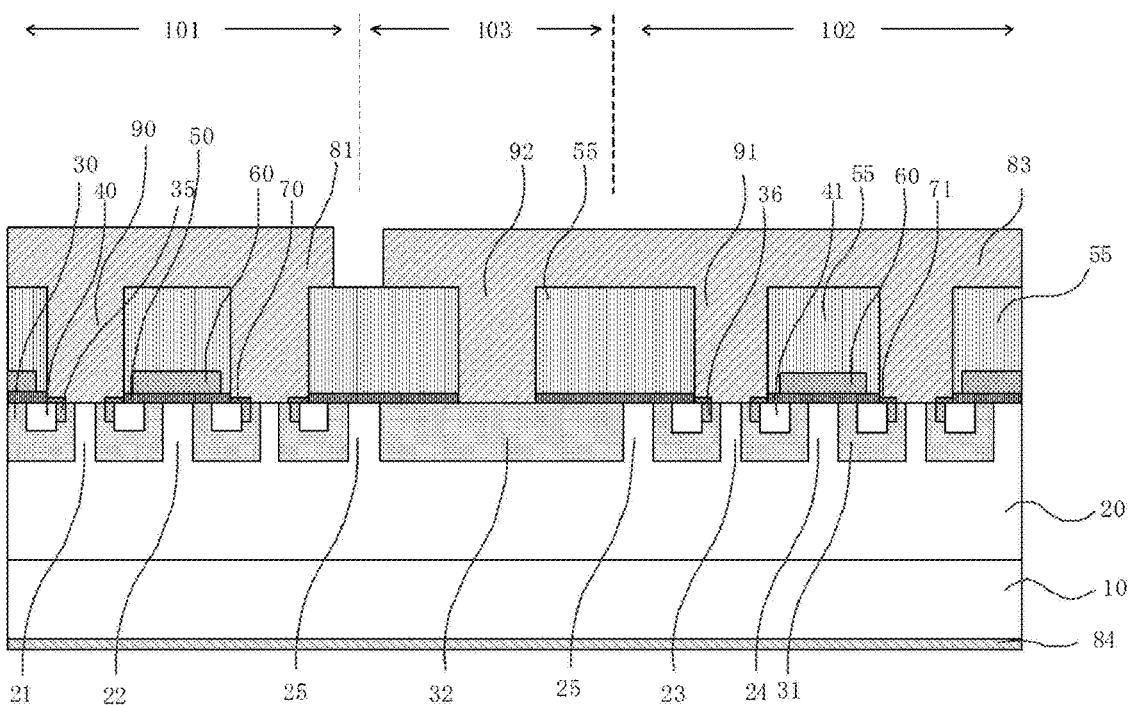
FIG. 5 A cross-sectional view of a part of the silicon carbide semiconductor device according to another embodiment of the embodiment 1 of the present invention.

FIG. 5 is a cross-sectional view of another embodiment of the silicon carbide semiconductor device according to the present embodiment. In FIG. 5, the gate insulating film 50 is formed on the dummy sense well region 32, and the gate electrode 60 is not formed on the dummy sense well region 32. According to this structure, fluctuation of potential of the dummy sense well region 32 caused by potential of the gate electrode 60 changing depending on an ON/OFF operation can be suppressed, thus reliability can be further increased in terms of this.

FIG. 6 is a cross-sectional view of another embodiment of the silicon carbide semiconductor device according to the present embodiment. In addition to the structure in FIG. 5, an n-type low resistive layer 42 made of silicon carbide is formed on an upper layer part of the dummy sense well region 32. Herein, a dummy sense ohmic electrode 72 is formed on the dummy sense well region 32, and the low resistive layer 42 and the sense pad 83 are ohmic-connected to each other through the third contact hole 92. It is sufficient that an impurity concentration of the n-type low resistive layer 42 is within a range from $1\times10^{18}$ to $1\times10^{21}$ cm$^{-3}$, which is the same as that of the source region 40.

Herein, the sense pad 83 is ohmic-connected to the n-type low resistive layer 42, and is not ohmic-connected to the p-type dummy sense well region 32. The low resistive layer 42 is provided, thus voltage occurring in the dummy sense well region 32 in the switching operation can be reduced.

Figure 7:
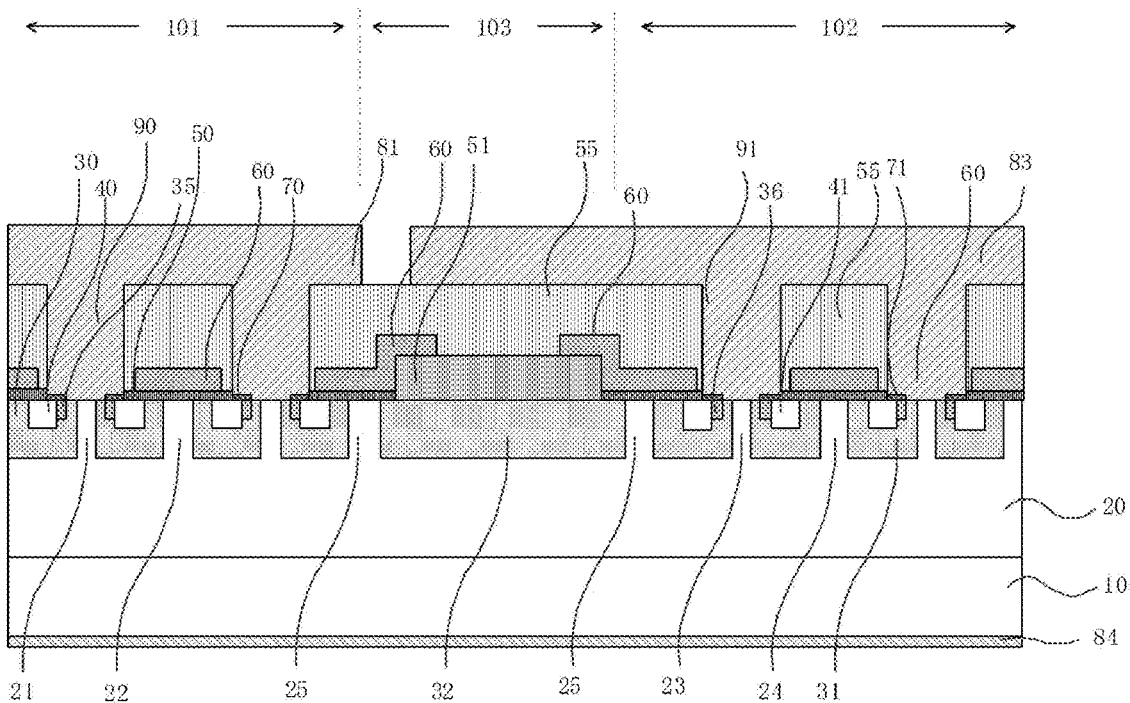
FIG. 7 A cross-sectional view of a part of the silicon carbide semiconductor device according to another embodiment of the embodiment 1 of the present invention.

The dummy sense well region 32 may be completely covered by an insulating film. FIG. 7 is a cross-sectional view of another embodiment of the silicon carbide semiconductor device according to the present embodiment. In FIG. 7, an upper part of the dummy sense well region 32 is covered by the gate insulating film 50 or the field insulating film 51, and is not connected to any of the source electrode 80 and the sense pad 83. Thus, also according to the present structure, achievable are the silicon carbide semiconductor device capable of connecting an ammeter which can measure minute current to the sense source electrode and measuring sense current with high accuracy while preventing occurrence of deterioration in power conduction in the silicon carbide semiconductor device.

Embodiment 2

The SiC-MOSFET as the silicon carbide semiconductor device according to the present embodiment is different from that in the embodiment 1 in that a gate-sense source capacity is formed on the dummy sense well region 32 of the SiC-MOSFET. The other points are similar to those of the embodiment 1, thus the detailed description is omitted.

Figure 8:
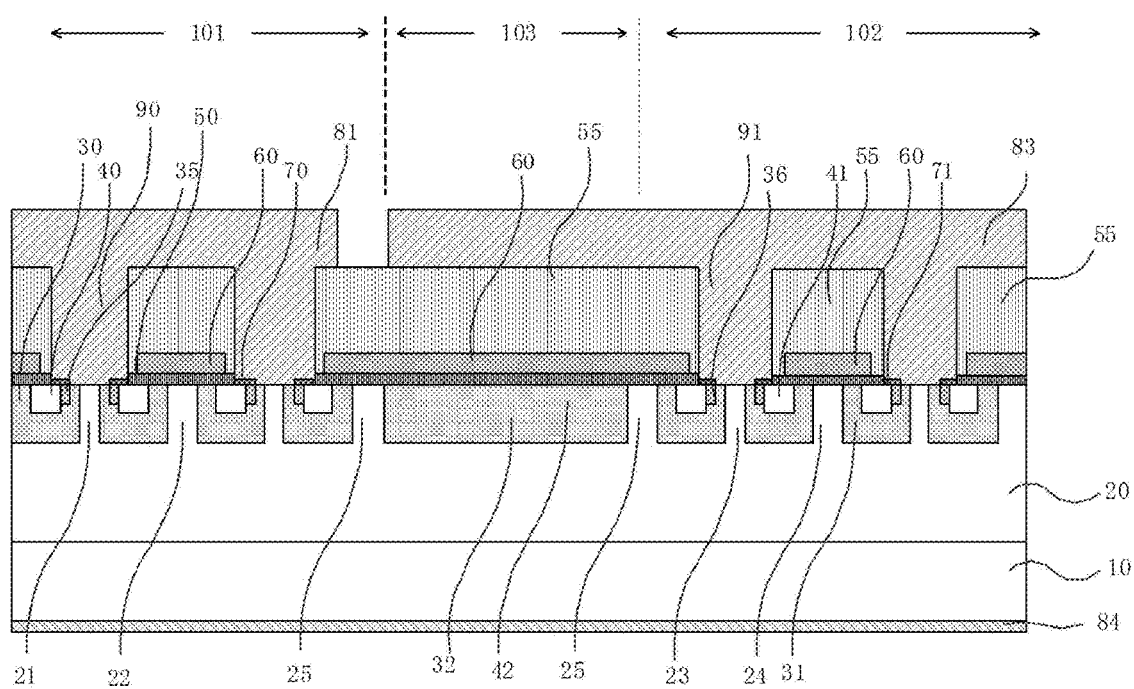
FIG. 8 A cross-sectional view of a part of the silicon carbide semiconductor device according to an embodiment 2 of the present invention.

FIG. 8 is a cross-sectional view of the SiC-MOSFET of the silicon carbide semiconductor device according to the present embodiment. In FIG. 8, the gate insulating film 50 is formed on the dummy sense well region 32, and the gate electrode 60 is formed on the gate insulating film 50. The dummy sense well region 32 is Schottky-connected to the sense pad 83 in a certain position in a depth direction of a paper sheet (not shown). The gate electrode 60 may be formed on a whole dummy sense well region 32 except for a position of Schottky connection, or may also be formed on a part of the dummy sense well region 32 as shown by the cross-sectional view in FIG. 9.

According to the SIC-MOSFET in the silicon carbide semiconductor device of the present embodiment, the capacity can be added between the gate pad 82 and the sense pad 83, thus electrostatic resistance can be increased, and reliability of the element can be increased.

In the SiC-MOSFET in the silicon carbide semiconductor device according to the present embodiment, the n-type low resistive layer 42 having low resistance may be formed on an upper layer part of the dummy sense well region 32 as shown by the schematic cross-sectional view in FIG. 10. The low resistive layer 42 is disposed to face the gate electrode 60 with the gate insulating film 50 therebetween, thus the gate-sense source capacity can be further increased, and a capacity fluctuation caused by the gate voltage can be further reduced.

Furthermore, the SBD may be formed in the dummy sense well region 32 as shown by the cross-sectional view in FIG. 11. In FIG. 11, a sixth separation region 26 as a part of the drift layer 20 formed in the inner part of the dummy sense well region 32 in a plan view and the sense pad 83 in the third contact hole 92 are Schottky-connected to each other. The SBD is formed in the dummy sense well region 32, thus deterioration in power conduction of the dummy sense region 103 can be further reduced.

Figure 12:
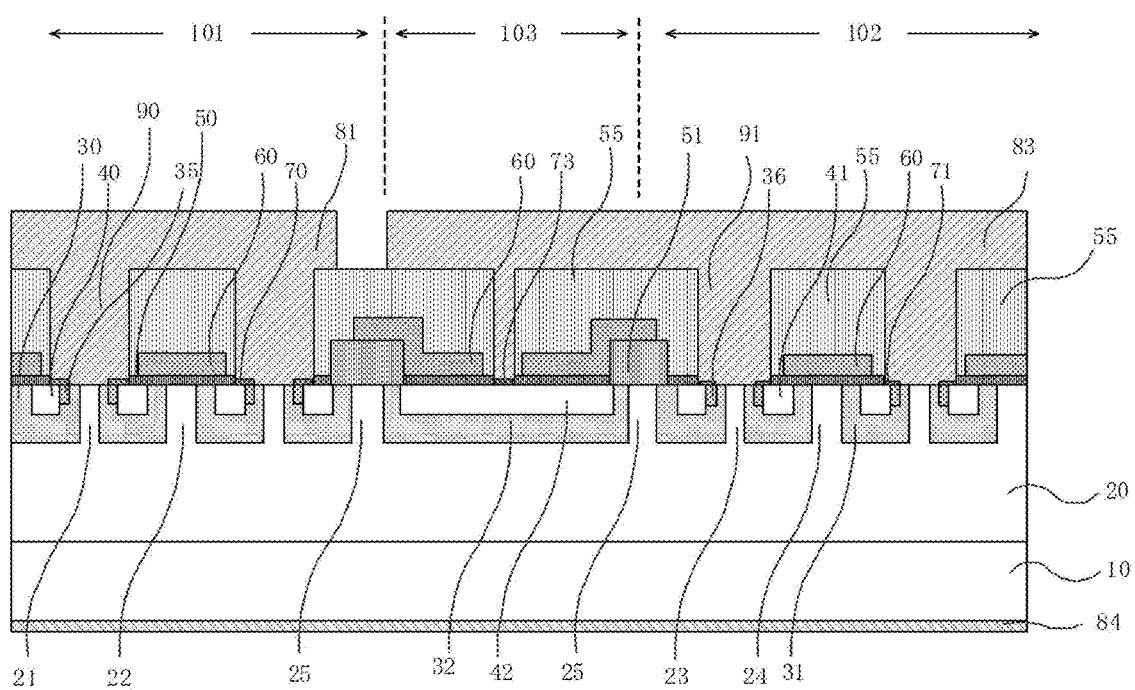
FIG. 12 A cross-sectional view of a part of the silicon carbide semiconductor device according to the embodiment 2 of the present invention.

It is also applicable that the n-type low resistive layer 42 formed on the upper layer part of the dummy sense well region 32 and the sense pad 83 in the third contact hole 92 are ohmic connected to each other, and the low resistive layer 42 and the gate electrode 60 face each other via the gate insulating film 50 as shown by the cross-sectional view in FIG. 12. According to this structure, occurrence of deterioration in power conduction can be prevented while the gate-sense source capacity is kept large.

Embodiment 3

An SiC-MOSFET as a silicon carbide semiconductor device according to the present embodiment is different from those of the embodiments 1 and 2 in that MOSFETS in the active region 101 and the active sense region 102 are trench type MOSFETs. The other points are similar to those of the embodiments 1 and 2, thus the detailed description is omitted.

FIG. 13 is a cross-sectional view of the SiC-MOSFET of the silicon carbide semiconductor device according to the present embodiment. In FIG. 13, in the active region 101, a first trench 94 passing through the p-type well region 30 formed on the surface layer part of the n-type drift layer 20 and the n-type source region 40 to reach the drift layer 20 is formed, and the gate electrode 60 is formed in the first trench 94 via the gate insulating film 50. The well contact region 35 is formed in a part of the well region 30, and the source electrode 81 is formed on the ohmic electrode 70 on the well contact region 35 and the source region 40. These constituent elements constitute a trench MOSFET.

The n-type first separation region 21 between the well region 30 and the well region 30 is a part of the drift layer 20, and is Schottky-connected to the source electrode 81 formed thereon to form the SBD.

In the active sense region 102, a second trench 95 passing through the p-type sense well region 31 formed on the surface layer part of the n-type drift layer 20 and the n-type sense source region 41 to reach the drift layer 20 is formed, and the gate electrode 60 is formed in the second trench 95 via the gate insulating film 50. The interlayer insulating film 55 is formed on the gate electrode 60. The sense contact region 36 is formed in a part of the sense well region 31, and the sense pad 83 is formed on the sense ohmic electrode 71 on the sense contact region 36 and the sense source region 41. These constituent elements constitute a trench MOSFET. The n-type third separation region 23 between the sense well region 31 and the sense well region 31 is a part of the drift layer 20, and is Schottky-connected to the sense pad 83 formed thereon to form the SBD.

The p-type dummy sense well region 32 is formed on the surface layer part of the drift layer 20 in the dummy sense region 103 between the active region 101 and the active sense region 102 in the manner similar to the embodiment 1. The interlayer insulating film 55 is formed on the dummy sense well region 32 to cover the whole dummy sense well region 32.

A method of manufacturing the SiC-MOSFET as the silicon carbide semiconductor device according to the present embodiment is similar to that according to the embodiment 1 except that the trench MOSFET is manufactured by a general manufacturing method, thus the detailed description is omitted. The first trench 94 of the active region 101 and the second trench 95 of the active sense region 102 may be formed at the same time.

Also in the SiC-MOSFET as the silicon carbide semiconductor device according to the present embodiment, deterioration in power conduction can be suppressed without increasing the invalid current caused by the sense current.

Figure 15:
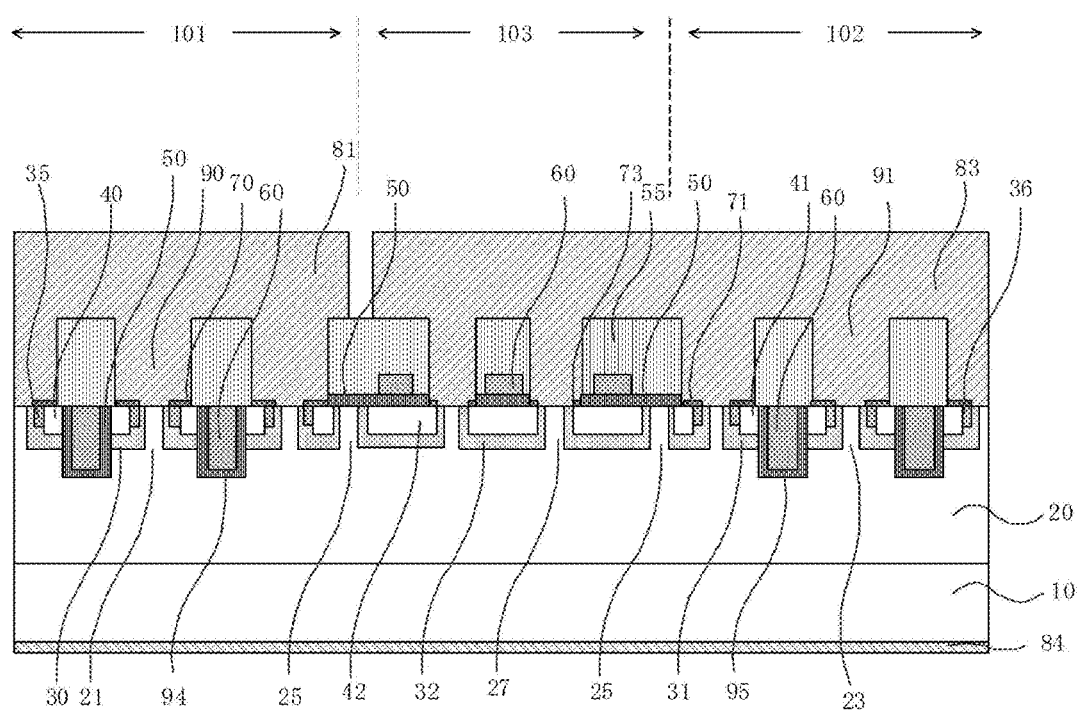
FIG. 15 A cross-sectional view of a part of the silicon carbide semiconductor device according to another embodiment of the embodiment 3 of the present invention.

The gate electrode 60 may be provided in the dummy sense well region 32 of the SiC-MOSFET as the silicon carbide semiconductor device according to the present embodiment via the gate insulating film as shown by the cross-sectional view in FIG. 14. The n-type low resistive layer 42 having low resistance is formed on the upper layer part of the dummy sense well region 32, the low resistive layer 42 and the sense pad 83 in the third contact hole 92 are ohmic-connected to each other via the dummy sense ohmic electrode 72, and the low resistive layer 42 and the gate electrode 60 face each other via the gate insulating film 50. The dummy sense well region 32 is not ohmic-connected to the sense pad 83 in the manner similar to the embodiment 1. The structure in FIG. 14 is adopted, thus the gate-sense source capacity can be increased, and reliability of the element can be further increased. It is also applicable that the dummy sense well region 32 is divided, and the gate insulating film 50 and the gate electrode 60 are provided on the divided dummy sense well regions 32, respectively, to provide the SBD in which the n-type seventh separation region 27 between the dummy sense well region 32 and the sense pad 83 are Schottky-connected to each other as shown by the schematic cross-sectional view in FIG. 15. Herein, also applicable is a cell structure in which a cycle period of the active region 101 and a cycle period of the dummy sense region 103 are the same as each other.

Also herein, the dummy sense well region 32 is not ohmic-connected to any of the source electrode 81 and the sense pad 83.

Figure 16:
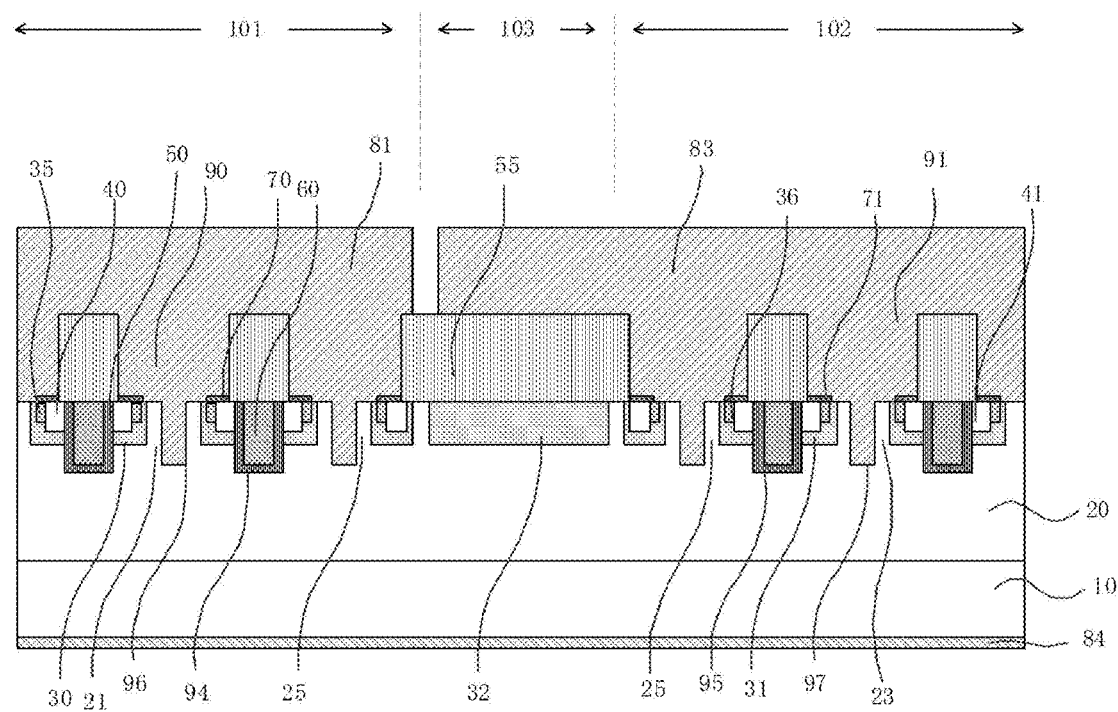
FIG. 16 A cross-sectional view of a part of the silicon carbide semiconductor device according to another embodiment of the embodiment 3 of the present invention.

The Schottky diode may be provided in a trench provided separately from the trench of the trench MOS. FIG. 16 is a cross-sectional view of another embodiment of the SiC-MOSFET as the silicon carbide semiconductor device according to the present embodiment. In the SiC-MOSFET having a structure in FIG. 16, a trench for the MOSFET and a trench for the Schottky diode are separately formed in the active region 101 and the active sense region 102. The trench for the Schottky diode in the active region 101 is a third trench 96, and the trench for the Schottky diode in the active sense region 102 is a fourth trench 97.

In the active region 101, the gate trench (first trench) 94 forming the MOSFET is formed to pass through the well region 30 and the source region 40 to reach the drift layer 20, and the gate electrode 60 is formed in the gate trench (first trench) 94 via the gate insulating film 50. The Schottky trench (third trench) 96 forming the Schottky diode is formed in the drift layer 20.

In the active sense region 102, the gate trench (second trench) 95 forming the MOSFET is formed to pass through the sense well region 31 and the sense source region 41 to reach the drift layer 20, and the gate electrode 60 is formed in the gate trench (second trench) 95 via the gate insulating film 50. The Schottky trench (fourth trench) 97 forming the Schottky diode is formed in the drift layer 20.

In the dummy sense region 103, the dummy sense well region 32 is formed on the upper layer part of the drift layer 20, and a whole region or only a part of an upper part of the dummy sense well region 32 may be covered by the interlayer insulating film 55. When the dummy sense well region 32 has contact with the source electrode 81 or the sense pad 83, Schottky junction is formed therebetween. The dummy sense well region 32 is not ohmic-connected to any of the source electrode 81 and the sense pad 83, thus current does not flow in the drain electrode 84 from the source electrode 81 or the sense pad 83 through the dummy sense well region 32 also in the reflux operation. That is to say, suppressed is a flow of forward current in a pn junction between the dummy sense well region 32 and the drift layer 20.

Herein, the gate electrode 60 may be provided on the dummy sense well region 32 via the gate insulating film 50 as shown by the cross-sectional view in FIG. 17. The n-type low resistive layer 42 having low resistance is formed on the upper layer part of the dummy sense well region 32, the low resistive layer 42 and the sense pad 83 in the third contact hole 92 are ohmic-connected to each other, and the low resistive layer 42 and the gate electrode 60 face each other via the gate insulating film 50. The dummy sense well region 32 is not ohmic-connected to the sense pad 83 in the manner similar to the embodiment 1. According to such a configuration, the gate-sense source capacity can be increased, thus electrostatic resistance can be increased, and reliability of the element can be increased.

Figure 18:
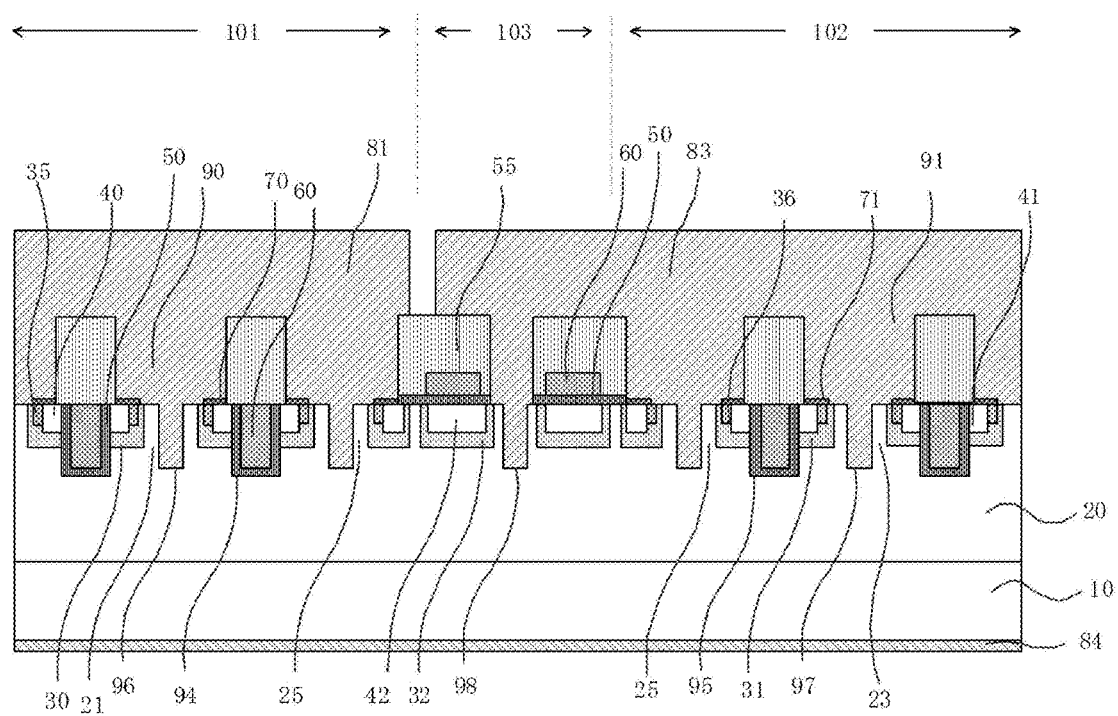
FIG. 18 A cross-sectional view of a part of the silicon carbide semiconductor device according to another embodiment of the embodiment 3 of the present invention.

Furthermore, a trench type Schottky trench (fifth trench) 98 may be provided in the dummy sense region 103. FIG. 18 is a cross-sectional view of the silicon carbide semiconductor device according to the present embodiment. In FIG. 18, the dummy sense well regions 32 are formed at intervals in the dummy sense region 103, and the Schottky trench (fifth trench) 98 is formed between the dummy sense well regions 32. The sense pad 83 is formed in the Schottky trench (fifth trench) 98, and the sense pad 83 is Schottky-connected to the drift layer 20. According to the structure in FIG. 18, the Schottky diode having a large area can be formed also in the dummy sense well region 32, and occurrence of deterioration in power conduction in the dummy sense region 103 can be further reduced.

Figure 19:
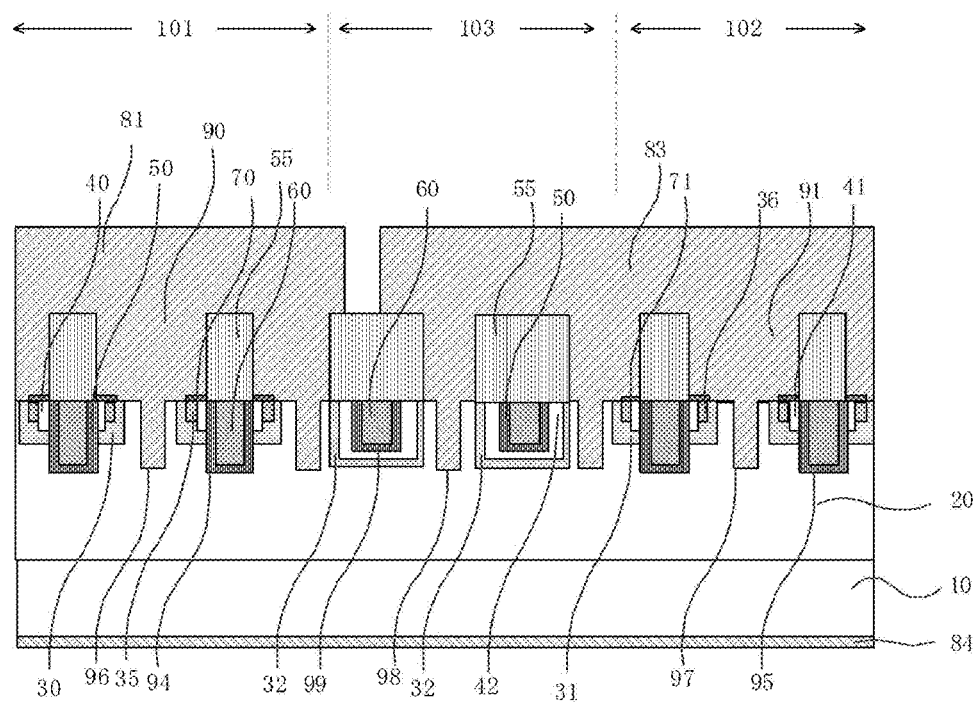
FIG. 19 A cross-sectional view of a part of the silicon carbide semiconductor device according to another embodiment of the embodiment 3 of the present invention.

FIG. 19 is a cross-sectional view of a silicon carbide semiconductor device according to another embodiment of the present embodiment. In FIG. 19, a trench (sixth trench) 99 which does not pass through the dummy sense well region 32 is formed in the dummy sense well region 32, and the gate electrode 60 is formed in the trench via the gate insulating film 50. The n-type low resistive layer 42 is formed on the upper layer part of the dummy sense well region 32 and a bottom of the trench (sixth trench) 99, and faces the gate electrode 60 via the gate insulating film 50. When a depth of the sixth trench 99 is designed to be substantially equal to that of the first to fourth trenches, the dummy sense well region 32 needs to be formed to be deeper than the other well regions. The dummy sense well region 32 may be formed by ion implantation with high energy before the formation of the sixth trench 99, or may also be formed by ion implantation with an inclination on a trench surface after the formation of the sixth trench 99. The low resistive layer 42 may be deeply formed in the manner similar to the dummy sense well region 32, or may also be formed at the same time as the other source region 40 to have the same depth as the other source region 40.

According to the silicon carbide semiconductor device having the structure in FIG. 19, the gate-sense source capacity added to the gate electrode 60 can be increased, thus electrostatic resistance can be increased, and reliability of the element can be further increased.

Figure 20:
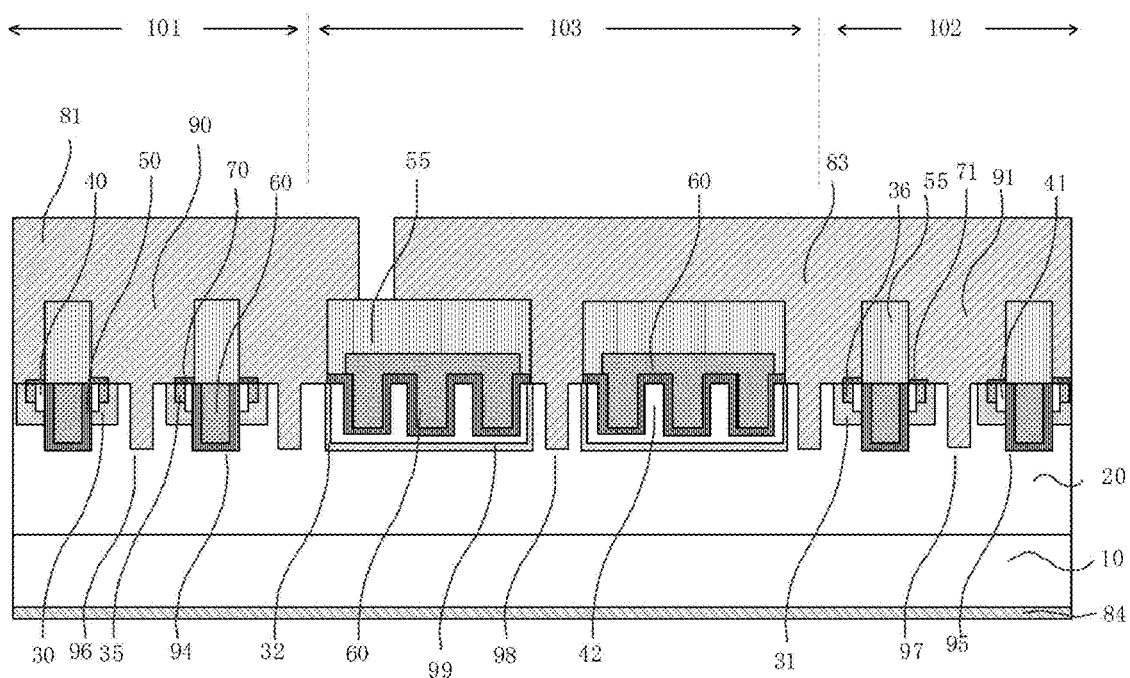
FIG. 20 A cross-sectional view of a part of the silicon carbide semiconductor device according to another embodiment of the embodiment 3 of the present invention.

FIG. 20 is a cross-sectional view of a silicon carbide semiconductor device having another structure of the present embodiment. The silicon carbide semiconductor device having the structure in FIG. 20 is different from that in FIG. 19 in that a plurality of structures similar to the gate trench (sixth trench) are continuously formed without intervention of the Schottky region. According to the silicon carbide semiconductor device having such a structure, the gate-sense source capacity added to the gate electrode 60 can be further increased, thus electrostatic resistance can be increased, and reliability of the element can be further increased.

Described in the embodiments 1 to 3 is the example of Schottky-connecting or pn-joining the dummy sense well region 32 to mainly the sense pad 83, however, the dummy sense well region 32 may also be Schottky-connected or pn-joined to the source electrode 81.

In the embodiments 1 to 3, the impurity concentration between the active region 101 and the dummy sense region 103 and between the active sense region 102 and the dummy sense region 103 is the same as that of the drift layer 20, however, the n-type impurity concentration in these regions may be higher than that of the drift layer 20. It is also applicable that the source electrode 81 or the sense pad 83 is formed on the upper part of the drift layer 20 between the active region 101 and the dummy sense region 103 and between the active sense region 102 and the dummy sense region 103, and the drift layer 20 is Schottky-connected to the source electrode 81 or the electrode of the sense pad 83. Furthermore, as illustrated in FIG. 12, for example, the upper part of the drift layer 20 between the active region 101 and the dummy sense region 103 and between the active sense region 102 and the dummy sense region 103 may be covered by an insulating film such as the field insulating film 51 having a larger film thickness than the gate insulating film 50.

Aluminum (Al) is used as the p-type impurity in the embodiments 1 to 3, however, the p-type impurity may be boron (B) or gallium (Ga). The n-type impurity may be phosphorus (P) instead of nitrogen (N). In the MOSFET described in the embodiments 1 to 4, the gate insulating film needs not necessarily be an oxide film such as $SiO_2$, however, an insulating film other than the oxide film or a combination of an insulating film other than the oxide film and an oxide film may also be applicable. Mainly described is the example that silicon oxide made by thermally oxidizing silicon carbide is used as the gate insulating film 50, however, silicon oxide of a deposited film by a CVD method may also be used. In the description of the embodiments described above, a specific example is used in the crystal structure, the plane direction of the main surface, the off angle, and each implantation condition, for example, however, an application range is not limited to these numeral value ranges. Furthermore, in the embodiment described above, the silicon carbide semiconductor device of a so-called vertical MOSFET is described, however, the above configurations can also be applied to a MOSFET having a super junction structure.

Embodiment 4

The silicon carbide semiconductor device according to the embodiments 1 to 3 described above is applied to a power conversion device in the present embodiment. The present disclosure is not limited to a particular power conversion device, however, described hereinafter is a case of applying the present disclosure to a three-phase inverter as the embodiment 4.

FIG. 21 is a block diagram illustrating a configuration of a power conversion system to which a power conversion device according to the present embodiment is applied.

The power conversion system illustrated in FIG. 21 includes a power source 150, a power conversion device 200, and a load 300. The power source 150 is a direct current power source, and supplies direct current power to the power conversion device 200. The power source 100 can be made up of various components, thus can be made up of a direct current system, a solar battery, or a storage battery, for example, and may also be made up of a rectification circuit connected to an alternating current system or an AC/DC converter. The power source 150 may also be made up of a DC/DC converter converting a direct current power being output from a direct current system into predetermined power.

The power conversion device 200 is a three-phase inverter connected between the power source 150 and the load 300, converts direct current power supplied from the power source 150 into alternating current power, and supplies the alternating current power to the load 300. As illustrated in FIG. 18, the power conversion device 200 includes a main conversion circuit 201 converting direct current power into alternating current power and outputs the alternating current power, a drive circuit 202 outputting a drive signal driving each switching element of the main conversion circuit 201, and a control circuit 203 outputting a control signal controlling the drive circuit 202 to the drive circuit 202.

The drive circuit 202 performs OFF control on each normally-off type switching element by making the voltage of the gate electrode and the voltage of the source electrode have the same potential.

The load 300 is a three-phase electrical motor driven by the alternating current power supplied from the power conversion device 200. The load 300 is not for a specific purpose of usage, but is an electrical motor mounted on various types of electrical devices, and is used as an electrical motor for a hybrid automobile, an electrical automobile, a railroad vehicle, an elevator, or an air-conditioning apparatus, for example.

Details of the power conversion device 200 are described hereinafter. The main conversion circuit 201 includes a switching element and a reflux diode (not shown), and when the switching element is switched, the main conversion circuit 201 converts the direct current power supplied from the power source 150 into the alternating current power, and supplies the alternating current power to the load 300. There are various specific circuit configurations of the main conversion circuit 201. The main conversion circuit 201 according to the present embodiment is a three-phase full-bridge circuit with two levels, and can be made up of six switching elements and six reflux diodes antiparallel to the switching elements, respectively. The silicon carbide semiconductor device according to any one of the embodiments 1 to 6 described above is applied to each switching element of the main conversion circuit 201. The six switching elements are connected two by two in series to constitute upper and lower arms, and each pair of the upper and lower arms constitutes each phase (U phase, V phase, and W phase) of a full-bridge circuit. Output terminals of each pair of the upper and lower arms, that is to say, three output terminals of the main conversion circuit 201 are connected to the load 300.

The drive circuit 202 generates the drive signal driving the switching element of the main conversion circuit 201, and supplies the drive signal to a control electrode of the switching element of the main conversion circuit 201. Specifically, the drive circuit 202 outputs a drive signal for making the switching element enter an ON state and a drive signal for making the switching element enter an OFF state to a control electrode of each switching element in accordance with a control signal from the control circuit 203 describe hereinafter. When the switching element is kept in the ON state, the drive signal is a voltage signal (ON signal) equal to or larger than a threshold voltage of the switching element, and when the switching element is kept in the OFF state, the drive signal is a voltage signal (OFF signal) equal to or smaller than the threshold voltage of the switching element.

The control circuit 203 controls the switching element of the main conversion circuit 201 so that desired electrical power is supplied to the load 300. Specifically, the control circuit 203 calculates a time (ON time) at which each switching element of the main conversion circuit 201 should enter the ON state based on the electrical power to be supplied to the load 300. For example, the control circuit 203 can control the main conversion circuit 201 by PWM control modulating the ON time of the switching element in accordance with the voltage to be output. Then, the control circuit 203 outputs to a control command (control signal) to the drive circuit 202 so that the ON signal is output to the switching element which should enter the ON state and the OFF signal is output to the switching element which should enter the OFF state at each point of time. The drive circuit 202 outputs the ON signal or the OFF signal as the drive signal to the control electrode of each switching element in accordance with the control signal.

In the power conversion device according to the present embodiment, the silicon carbide semiconductor device according to the embodiments 1 to 3 is applied as the switching element of the main conversion circuit 201, thus a low loss power conversion device with increased reliability of high-speed switching can be achieved, Described in the present embodiment is the example of applying the present disclosure to the three-phase inverter with two levels. However, the present disclosure is not limited thereto, but can be applied to various power conversion devices. The power conversion device with two levels is described in the present embodiment, however, a power conversion device with three levels or multiple levels is also applicable, and the present disclosure may be applied to a single-phase inverter when the electrical power is supplied to a single-phase load. When the electrical power is supplied to a direct current load, for example, the present disclosure can be applied to a DC/DC converter or an AC/DC converter.

The power conversion device to which the present disclosure is applied is not limited to the case where the load is the electrical motor described above, but can also be used as a power source device of an electrical discharge machine, a laser beam machine, an induction heat cooking machine, or a non-contact power supply system, and further can also be used as a power conditioner of a solar power system or an electricity storage system, for example.

EXPLANATION OF REFERENCE SIGNS

10 semiconductor substrate, 20 drift layer, 21 first separation region, 22 second separation region, 23 third separation region, 24 fourth separation region, fifth separation region, 30 well region, 31 sense well region, 32 dummy sense well region, 35 well contact region, 36 sense contact region, 40 source region, 41 sense source region, 42 low resistive layer, 50 gate insulating film, 51 field insulating film, 55 interlayer insulating film, 60 gate electrode, 70 ohmic electrode, 71 sense ohmic electrode, 72 dummy sense ohmic electrode, 81 source electrode, 82 gate pad, 83 sense pad, 84 drain electrode, 90 first contact hole, 91 second contact hole, 92 third contact hole, 94 first trench, 95 second trench, 96 third trench, 97 fourth trench, 98 fifth trench, 99 sixth trench, 101 active region, 102 active sense region, 103 dummy sense region, 150 power source, 200 power conversion device, 201 main conversion device, 202 drive circuit, 203 control circuit, 300 load.

The invention claimed is:

1. A silicon carbide semiconductor device, comprising:
a dummy sense region formed between an active region and an active sense region;
a silicon carbide semiconductor substrate of a first conductivity type;
a drift layer of a first conductivity type formed on the semiconductor substrate;
a plurality of first well regions of a second conductivity type provided on the drift layer of the active region;
a plurality of first separation regions of a first conductivity type each formed adjacent to each of the first well regions;

a first ohmic electrode provided on the first well regions;

a source region of a first conductivity type formed on surface layer parts of the first well regions;

a source electrode provided to have contact with the first separation regions in Schottky connection, and electrically connected to the first ohmic electrode;

a second well region of a second conductivity type provided on a surface layer of the drift layer of the active sense region separately from the first well regions;

a plurality of third separation regions of a first conductivity type formed adjacent to the second well region;

a second ohmic electrode provided on the second well region;

a sense pad provided to have contact with the third separation regions in Schottky connection, electrically connected to the second ohmic electrode, and formed in the active sense region and the dummy sense region;

a sense source region of a first conductivity type formed on a surface layer part of the second well region;

a gate insulating film formed to have contact with the first well regions and the second well region;

a gate electrode formed to face the first well regions and the second well region via the gate insulating film;

a gate pad electrically connected to the gate electrode, and a third well region of a second conductivity type which is formed on a surface layer of the drift layer in the dummy sense region between the first well regions and the second well region, is separated from the first well regions and the second well region, and is not ohmic-connected to any of the source electrode and the sense pad.

2. The silicon carbide semiconductor device according to claim 1, wherein
the third well region is Schottky-connected to the sense pad.

3. The silicon carbide semiconductor device according to claim 1, wherein
a low resistive layer of a first conductivity type is located on an upper layer part of the third well region, and the low resistive layer is ohmic-connected to the sense pad.

4. The silicon carbide semiconductor device according to claim 1, wherein
a fourth separation region of a first conductivity type is located in the third well region in a plan view, and the fourth separation region and the sense pad are Schottky-connected to each other.

5. The silicon carbide semiconductor device according to claim 1, wherein
the gate insulating film has contact with the third well region, and the gate electrode has contact with the gate insulating film having contact with the third well region.

6. The silicon carbide semiconductor device according to claim 1, wherein
in the active region, the gate insulating film is formed to have contact with a first trench passing through the source region and one of the first well regions, and in the active sense region, the gate insulating film is formed to have contact with a second trench passing through the sense source region and the second well region.

7. The silicon carbide semiconductor device according to claim 6, wherein
in the active region, the source electrode formed in a third trench provided separately from the first trench is Schottky-connected to the first separation region, and in the active sense region, the sense pad formed in a fourth trench provided separately from the second trench is Schottky-connected to the third separation region.

8. The silicon carbide semiconductor device according to claim 1, wherein
the dummy sense region has a cell structure with a same cycle period as the active region.

9. The silicon carbide semiconductor device according to claim 8, wherein
a fifth trench is located in the dummy sense region, and the sense pad formed in the fifth trench is Schottky-connected to the drift layer.

10. The silicon carbide semiconductor device according to claim 8, wherein
a sixth trench is located in the dummy sense region, and the gate electrode is formed in the sixth trench via the gate insulating film.

11. The silicon carbide semiconductor device according to claim 10, wherein
the sixth trench does not have contact with the drift layer.

12. A power conversion device, comprising:

a main conversion circuit including the silicon carbide semiconductor device according to claim 1 for converting and outputting electrical power which has been input;

a drive circuit making voltage of the gate electrode of the silicon carbide semiconductor device coincide with voltage of the source electrode, thereby making the silicon carbide semiconductor device perform an OFF operation, and outputting a drive signal driving the silicon carbide semiconductor device to the silicon carbide semiconductor device; and a control circuit outputting a control signal controlling the drive circuit to the drive circuit.

* * * * *